US012205626B2

(12) United States Patent
Benedict et al.

(10) Patent No.: US 12,205,626 B2
(45) Date of Patent: Jan. 21, 2025

(54) VICTIM ROW COUNTERS IN MEMORY DEVICES

(71) Applicant: HEWLETT PACKARD ENTERPRISE DEVELOPMENT LP, Houston, TX (US)

(72) Inventors: Melvin K. Benedict, Magnolia, TX (US); Eric L. Pope, Tomball, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 215 days.

(21) Appl. No.: 17/936,494

(22) Filed: Sep. 29, 2022

(65) Prior Publication Data

US 2024/0119985 A1  Apr. 11, 2024

(51) Int. Cl.
*G11C 11/00* (2006.01)
*G11C 11/406* (2006.01)
*G11C 11/4078* (2006.01)

(52) U.S. Cl.
CPC .. *G11C 11/40615* (2013.01); *G11C 11/40622* (2013.01); *G11C 11/4078* (2013.01)

(58) Field of Classification Search
CPC ......... G11C 11/40611; G11C 11/40618; G11C 11/4096; G11C 11/406; G11C 11/40622; G11C 11/4078; G11C 11/408; G11C 11/40615; G11C 11/54; G11C 11/4085; G11C 15/04; G11C 29/52; G11C 8/12; G11C 11/4076; G11C 11/4087; G11C 11/407; G11C 29/783; G11C 29/81; G11C 2211/4065; G11C 29/50; G11C 29/806; G11C 11/40603; G11C 2211/4061; G11C 5/025; G11C 5/04; G11C 15/00; G11C 8/06; G06F 12/145; G06F 21/79; G06F 2212/1052; G06F 11/1068; G06F 12/0646; G06F 21/577; G06F 12/0284; G06F 12/08; G06F 12/0868; G06F 12/0882; G06F 12/1018; G06F 12/123; G06F 12/126; G06F 2212/151; H01L 2224/32145; H01L 2224/32225; H01L 2224/48091;
(Continued)

(56) References Cited

U.S. PATENT DOCUMENTS 10,261,852 B2   4/2019   Benedict et al.
10,373,667 B2   8/2019   Benedict et al.
(Continued)

OTHER PUBLICATIONS

Wikipedia, "Isolation amplifier", available online at <https://en.wikipedia.org/w/index.php?title=Isolation_amplifier&oldid=1071403182>, Feb. 12, 2022, 5 pages.
(Continued)

*Primary Examiner* — Thong Q Le
(74) *Attorney, Agent, or Firm* — Trop, Pruner & Hu, P.C.

(57) ABSTRACT

In some examples, a memory device includes a plurality of rows of memory cells, a plurality of victim counters associated with respective rows of memory cells of the plurality of rows of memory cells, and a plurality of aggressor counters associated with the respective rows of memory cells. A first victim counter of the plurality of counters is associated with a first row of the plurality of rows of memory cells, the first victim counter to advance in response to advances in counts of aggressor counters associated with neighboring rows of memory cells that are neighbors of the first row.

20 Claims, 6 Drawing Sheets

(58) Field of Classification Search
CPC . H01L 2224/48145; H01L 2224/48227; H01L 2224/73265; H01L 2225/06506; H01L 2225/0651; H01L 2225/06562; H01L 24/48; H01L 25/0657; H01L 2924/00; H01L 2924/00012; H01L 2924/15311
See application file for complete search history.

(56) References Cited

U.S. PATENT DOCUMENTS

| | | |
|---|---|---|
| 10,636,476 B2 * | 4/2020 | Nale .................. G11C 11/4078 |
| 11,474,706 B2 | 10/2022 | Benedict et al. |
| 2016/0077751 A1 | 3/2016 | Benedict |
| 2016/0202926 A1 | 7/2016 | Benedict |
| 2022/0115057 A1 | 4/2022 | Pope et al. |
| 2022/0284944 A1 | 9/2022 | Benedict |

OTHER PUBLICATIONS

Wikipedia, "Op amp integrator", available online at <https://en.wikipedia.org/w/index.php?title=Op_amp_integrator&oldid=1108700432>, Sep. 5, 2022, 5 pages.

* cited by examiner

VICTIM ROW COUNTERS IN MEMORY DEVICES

BACKGROUND

A memory device includes memory cells to store data. Each memory cell includes a data storage structure to store data. In some examples, the data storage structure of a memory cell can include a storage capacitor. In other examples, data storage structures of memory cells can include floating gates that trap electrical charge to represent data, resistive elements that represent data as a resistance, and so forth.

BRIEF DESCRIPTION OF THE DRAWINGS

Some implementations of the present disclosure are described with respect to the following figures.

Figure 1:
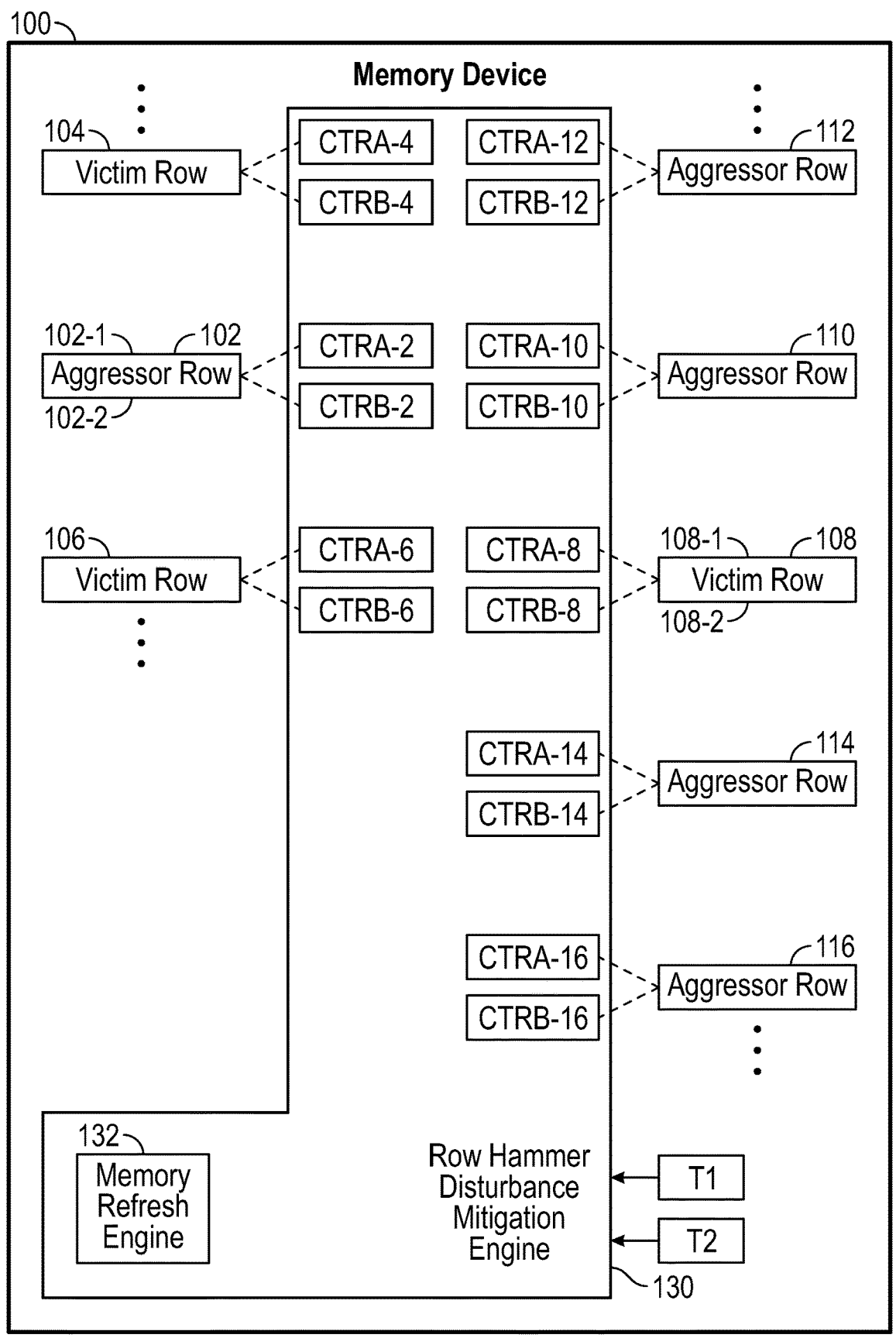
FIG. 1 is a block diagram of a memory device according to some examples.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an," or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

An example type of memory device includes a dynamic random access memory (DRAM) device. A DRAM device has memory cells that each includes a storage capacitor and an access transistor connected to the storage capacitor.

Although the ensuing discussion refers to DRAM devices, it is noted that techniques or mechanisms according to some implementations of the present disclosure can be applied with other types of memory devices, such as memory devices that store data using floating gates (e.g., flash memory devices, electrically erasable and programmable read-only memory devices, etc.), memory devices that store data using resistive memory elements (e.g., resistive memory devices), and so forth.

The densities of memory cells in memory devices continue to increase with advancements in memory technology. Although a high memory cell density can lower the cost per bit of a memory device, the high memory cell density can lead to reduced reliability in storage of data in the memory device. As an example, memory cells arranged in a high density may be more susceptible to disturbance caused by access of neighboring memory cells.

The memory cells of a memory device may be arranged as rows and columns of memory cells. Each row of memory cells can be activated in response to activation of a row signal line (also referred to as a word line). When a given row signal line is activated, the memory cells of the given row are connected, such as through pass transistors, to corresponding column data lines to enable access of the memory cells of the given row. In an activated row of memory cells, column select signals can be used to select a number of column data lines (a single column data line or multiple column data lines) to access (read or write).

As used here, a "row" of memory cells can refer to any collection of memory cells that is to be activated together in response to an activation signal.

A row hammer refers to a type of disturbance that occurs when a row of memory cells (such as those of a DRAM device) is activated repeatedly within a time interval (e.g., a refresh interval of the DRAM device), which can cause data errors in memory cells of neighboring rows. For example, the disturbance can cause the memory cells of neighboring rows to leak charge at a faster rate than expected. In further examples, electrical or magnetic interference to the neighboring rows caused by a large quantity of accesses of a given row of memory cells may even flip the state of data bits in memory cells of the neighboring rows.

FIG. 1 is a block diagram of a memory device 100 according to some examples of the present disclosure. The memory device 100 includes various rows of memory cells. FIG. 1 shows two types of row hammer disturbances in the memory device 100. A first type of row hammer disturbance is caused by an "aggressor" row 102 disturbing multiple "victim" rows 104 and 106. An "aggressor" row refers to a row of memory cells that when activated results in disturbance of another row of memory cells, which is referred to as a "victim" row. As an example, the aggressor row 102 can disturb two (or more) neighboring rows 104 and 106 on the two respective sides 102-1 and 102-2 of the aggressor row 102. Note that it is possible for the aggressor row 102 to disturb multiple victim rows on the first side 102-1 of the aggressor row 102, and/or disturb multiple victim rows on the second side 102-2 of the aggressor row 102.

Although FIG. 1 shows some rows of memory cells as aggressor rows and other rows of memory cells as victim rows, note that an aggressor row can be a victim row when a neighboring row of memory cells is activated (this neighboring row is then the aggressor row).

A second type of row hammer disturbance is caused by multiple aggressor rows 110, 112, 114, and 116 disturbing a victim row 108. As an example, two (or more) aggressor rows 110 and 112 on a first side 108-1 of the victim row 108 if repeatedly access within a time interval (e.g., a refresh interval) may disturb the victim row 108, and two (or more) aggressor rows 114 and 116 on a second side 108-2 of the victim row 108 if repeatedly access within the time interval may disturb the victim row 108.

In some examples, row hammer detection mechanisms that are able to detect the first type of row hammer disturbance cannot detect the second type of row hammer disturbance. Not being able to reliably detect the second type of row hammer disturbance in a memory device can result in loss of data stored in the memory cells of the memory device.

A "refresh interval" as noted above refers to a time interval between a refresh of a given subset of memory cells. Because DRAM devices store data in storage capacitors, the electrical charge stored in the storage capacitors can slowly leak away, which can result in data loss. To address the foregoing issue, refresh operations can be performed in a DRAM device. A refresh operation performs a refresh of a subset of the memory cells of the DRAM device. A "subset" of memory cells can refer to N (N≥1) rows of memory cells, or any other refresh region of memory cells within an array of memory cells in a memory device.

A refresh operation involves reading data bits from the memory cells of the subset, and rewriting the data bits without modification back to the memory cells of the subset to preserve the data bits. The refresh interval is the maximum time interval between refreshes of any subset of memory cells to avoid data loss in the subset of memory cells.

If repeated accesses of aggressor rows of memory cells occur within a refresh interval that results in degradation of storage of data in memory cells of victim row(s), the memory cells of the victim row(s) may lose their data before a refresh operation occurs to recover data in the memory cells of the victim row(s). If a memory cell of a victim row is corrupted due to access of aggressor row(s), then a subsequent refresh operation to refresh the victim row can cause the corrupted data to be read and written back again to the memory cell, causing a data error.

Some memory devices have burst modes of operation in which row(s) of memory cells may be accessed repeatedly in a short period of time. Such row(s) of memory cells accessed during a burst mode can become aggressor row(s).

In other examples, malicious entities (e.g., users, programs, hardware devices, etc.) can seek to repeatedly access rows of memory cells in a short period of time in attempts at causing data loss.

In accordance with some implementations of the present disclosure, the memory device 100 includes a row hammer disturbance mitigation engine 130 to detect the second type of row hammer disturbance, and to initiate mitigation actions in the memory device in response to a detecting a condition in the memory device 100 indicative of the second type of row hammer disturbance. In some examples, the row hammer disturbance mitigation engine 130 can also detect the first type of row hammer disturbance.

As used here, an "engine" can refer to one or more hardware processing circuits, which can include any or some combination of a microprocessor, a core of a multi-core microprocessor, a microcontroller, a programmable integrated circuit, a programmable gate array, or another hardware processing circuit. Alternatively, an "engine" can refer to a combination of one or more hardware processing circuits and machine-readable instructions (software and/or firmware) executable on the one or more hardware processing circuits.

In some examples, the row hammer disturbance mitigation engine 130 includes multiple counters associated with each row of memory cells in the memory device 100. For example, a first row of memory cells is associated with a first group of multiple counters, a second row of memory cells is associated with a second group of multiple counters, and so forth.

In some examples according to FIG. 1, two counters CTRA and CTRB are associated with each row of memory cells for detecting the first and second types of row hammer disturbance. For example, the row 102 of memory cells is associated with counters CTRA-2 and CTRB-2, the row 104 of memory cells is associated with counters CTRA-4 and CTRB-4, the row 106 of memory cells is associated with counters CTRA-6 and CTRB-6, the row 108 of memory cells is associated with counters CTRA-8 and CTRB-8, the row 110 of memory cells is associated with counters CTRA-10 and CTRB-10, the row 112 of memory cells is associated with counters CTRA-12 and CTRB-12, the row 114 of memory cells is associated with counters CTRA-14 and CTRB-14, and the row 116 of memory cells is associated with counters CTRA-16 and CTRB-16.

The counter CTRB of a victim row is advanced in response to activations of aggressor row(s) of memory cells. The counter CTRA of an aggressor row is advanced in response to each activation of the aggressor row. In some examples, the counter CTRB of a victim row is advanced based on advances of the counters CTRA of neighboring aggressor rows.

In some examples, "advancing" a counter can refer to incrementing the counter, which can be initialized to an initial low value (e.g., 0 or some other low value). In further examples, "advancing" a counter can refer to decrementing the counter, which can be initialized to an initial high value (e.g., a maximum value of the counter given the quantity of bits used to implement the counter, or some other high value).

Figure 2A:
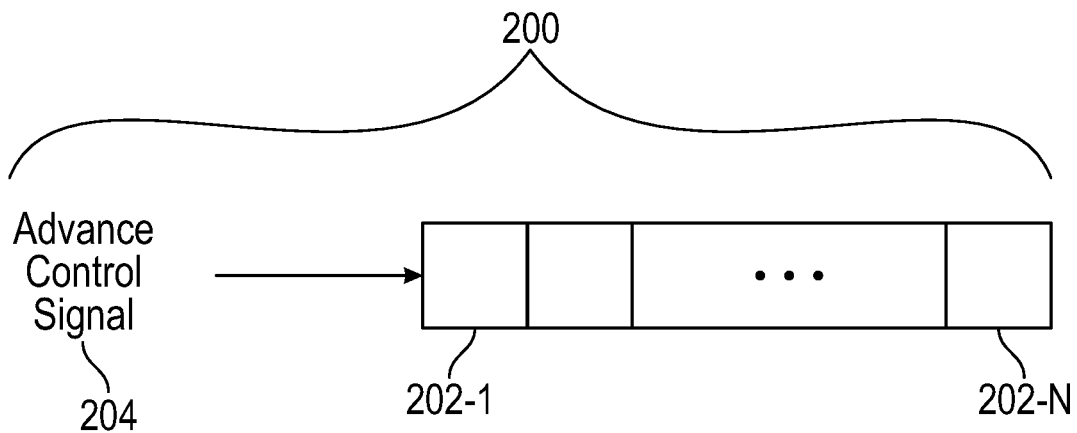
FIG. 2A is a block diagram of a digital counter according to some examples.

A "counter" can refer to either a digital counter or an analog counter. As shown in FIG. 2A, an example digital counter 200 has logic to store a number of bits 202-1 to 202-N (N≥2) that collectively represent a count of the counter. In response to an advance control signal 204 provided to the digital counter 200, the count of the digital counter 200 is advanced, such as by 1 or some other increment value. The advance control signal 204 can represent an activation of an aggressor row of memory cells, for example, or an advance of another counter.

Figure 2B:
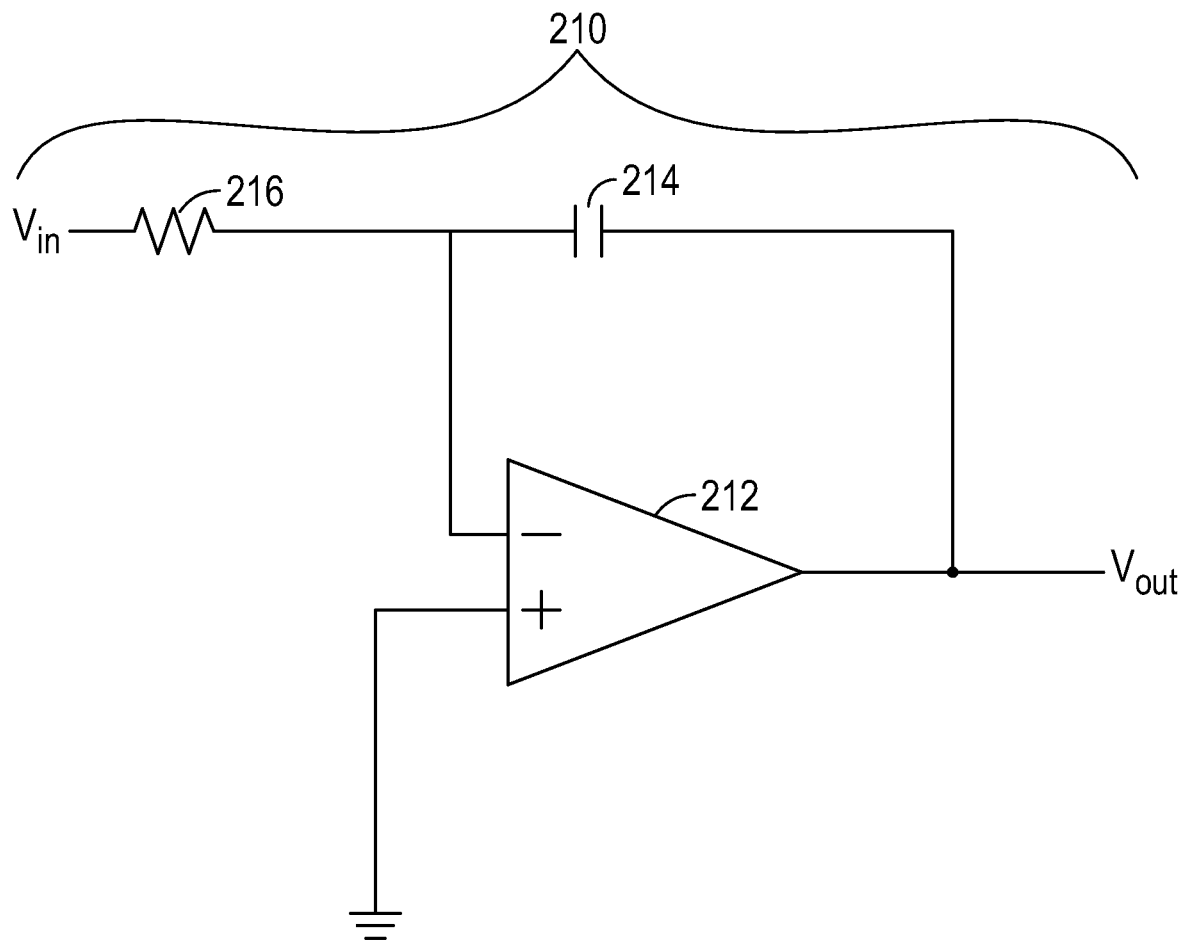
FIG. 2B is a block diagram of an analog counter according to some examples.

As shown in FIG. 2B, an example analog counter 210 can be implemented using a circuit arrangement including an operational amplifier 212, a capacitor 214, and a resistor 216. In other examples, an alternative circuit arrangement can be employed that has additional resistor(s) and/or capacitor(s). The circuit arrangement of the analog counter 210 implements an integrator that integrates an input voltage Vin over time. The output voltage Vout of the analog counter 210 has a voltage level that is produced by integrating Vin over time. The analog counter 210 can effectively keep a running count of the number of times a Vin pulse is supplied to the analog counter 210. The higher the voltage level of Vout, the higher the "count" of the analog counter 210. Each Vin pulse can represent an activation of an aggressor row of memory cells, for example, or an advance of another counter.

The advance of the counter CTRB can be a scaled advance based on the count of a counter CTRA. The scaled advance of CTRB can refer to an advance of CTRB that is based on the count of CTRA weighted by a scaling factor.

A counter CTRA is advanced when an associated row of memory cells is activated. For example, the counter CTRA-10 is advanced in response to an activation of the row of memory cells 110, the counter CTRA-12 is advanced in response to an activation of the row of memory cells 112, the counter CTRA-14 is advanced in response to an activation of the row of memory cells 114, the counter CTRA-16 is advanced in response to an activation of the row of memory cells 116, and so forth.

The following discusses an example of a scaled advance of a counter CTRB in response to advances of a counter CTRA. For example, if a scale factor is $$\frac{1}{X},$$

where X>0, then CTRB is advanced responsive to every X advances of CTRA. For example, if X=8, then CTRB is advanced for every 8 increments (or decrements) of CTRA. For example, CTRA and CTRB can both be initialized to 0. The counter CTRA increments in response to successive activations of an aggressor row of memory cells. Until CTRA reaches the value 8, CTRB does not increment even though CTRA has incremented from 0 to 7. When CTRA increments from 7 to 8, the counter CTRB is incremented from 0 to 1. Subsequently, CTRA can increment from 8 to 15 in response to further successive activations of the aggressor row of memory cells, but CTRB remains at the value 1. In response to CTRA incrementing from 15 to 16, the counter is incremented from 1 to 2.

The output of a counter CTRB is used to detect the second type of row hammer disturbance, and the output of a counter CTRA can be used to detect the first type of row hammer disturbance.

In response to detecting a row hammer disturbance (either the first type or the second type) of victim row(s) of memory cells, the row hammer disturbance mitigation engine 130 can initiate a mitigation action to avoid loss of data in the victim row(s). For example, the row hammer disturbance mitigation engine 130 can include a memory refresh engine 132 to initiate a refresh operation that refreshes the victim row(s) for which the row hammer disturbance was detected. The memory refresh engine 132 can refresh just the particular victim row(s) for which the row hammer disturbance was detected, or alternatively, the memory refresh engine 132 can refresh a refresh region of the memory device 100 that includes the victim row(s) for which the row hammer disturbance was detected.

Although FIG. 1 shows the memory refresh engine 132 as being part of the row hammer disturbance mitigation engine 130, in other examples, the memory refresh engine 132 can be separate from the row hammer disturbance mitigation engine 130. In such examples, in response to detecting a row hammer disturbance, the row hammer disturbance mitigation engine 130 can provide a mitigation control indication to the separate memory refresh engine 132 to refresh at least the particular victim row(s) for which the row hammer disturbance was detected. The mitigation control indication can include signals or a message that indicates which victim row(s) has (have) experienced row hammer disturbance, and the memory refresh engine 132 can respond to the mitigation control indication by refreshing at least the indicated victim row(s).

Second Type Row Hammer Disturbance Detection

Figure 3:
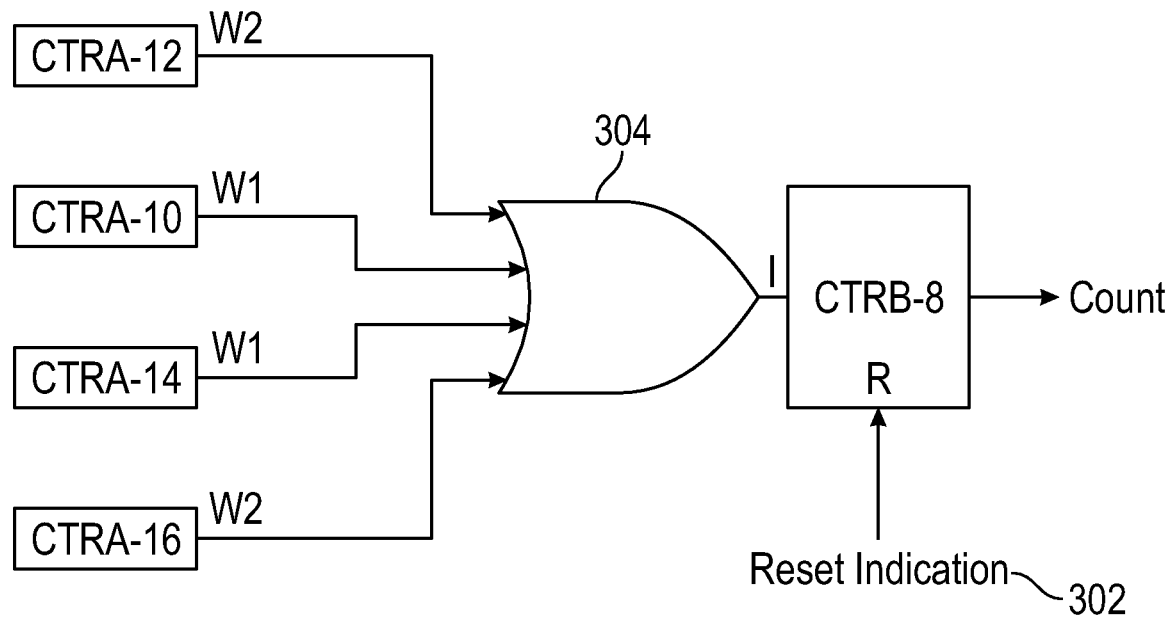
FIG. 3 is a block diagram of aggressor counters and a victim counter, according to some examples.

FIG. 3 shows an example of a counter arrangement for detecting the second type of row hammer disturbance. The counter CTRB-8 is associated with the victim row 108, while the counters CTRA-10, CTRA-12, CTRA-14, and CTRA-16 are associated with respective aggressor rows 110, 112, 114, and 116, which are neighboring rows of the victim row 108.

The aggressor rows 110 and 114 are immediate neighboring rows of the victim row 108; i.e., there are no rows of memory cells between the aggressor rows 110 and 114 and the victim row 108. The aggressor rows 112 and 116 are one-away neighboring rows of the victim row 108. A one-away neighboring row is a row where there is one intervening row of memory cells between the victim row and the neighboring row.

In the example of FIG. 3, it is assumed that the counter CTRB-8 is advanced in response to activations of 4 aggressor rows on the two sides 108-1 and 108-2 of the victim row 108. In further examples, the counter CTRB-8 can be advanced in response to activations of 6 (or more) aggressor rows on the two sides 108-1 and 108-2 of the victim row 108 (e.g., 3 or more aggressor rows on each side 108-1 or 108-2 of the victim row 108).

In the ensuing discussion, it is assumed that the counter CTRB-8 and the counters CTRA-10, CTRA-12, CTRA-14, and CTRA-16 are incremented. Similar techniques can be applied for counters that decrement.

The counter CTRB-8 is incremented in response to scaled counts of the counters CTRA-10, CTRA-12, CTRA-14, and CTRA-16. A first weight Weight1 defines a first scale factor for incrementing CTRB-8 in response to counts of the counters CTRA-10 and CTRA-14 associated with the immediate neighboring aggressor rows 110 and 114, and a second weight Weight2>Weight1 defines a second scale factor for incrementing CTRB-8 in response to counts of the counters CTRA-12 and CTRA-16 associated with the one-away neighboring aggressor rows 112 and 116. In FIG. 3, W1 represents a scaled count of a counter as scaled by a scaling factor derived from Weight1, and W2 represents a scaled count of a counter as scaled by a scaling factor derived from Weight2.

The first scaling factor is $$\frac{1}{2^{Weight1}};$$

in other words, CTRB-8 is incremented in response to every $2^{Weight1}$ increments of each of CTRA-10 and CTRA-14. In FIG. 3, W1 is equal to the count of a counter (either CTRA-10 or CTRA-14) multiplied by $$\frac{1}{2^{Weight1}}.$$

More specifically, CTRB-8 is incremented in response to every $2^{Weight1}$ increments of CTRA-10, and independently, CTRB-8 is incremented in response to every $2^{Weight1}$ increments of CTRA-14.

The second scaling factor is $$\frac{1}{2^{Weight2}};$$

in other words, CTRB-8 is incremented in response to every $2^{Weight2}$ increments of each of CTRA-12 and CTRA-16. In FIG. 3, W2 is equal to the count of a counter (either CTRA-12 or CTRA-16) multiplied by $$\frac{1}{2^{Weight2}}.$$

More specifically, CTRB-8 is incremented in response to every $2^{Weight2}$ increments of CTRA-12, and independently, CTRB-8 is incremented in response to every $2^{Weight1}$ increments of CTRA-16. Since Weight2>Weight1, CTRB-8 is incremented less frequently in response to increments of CTRA-12, CTRA-16 as compared to increments of CTRA-10, CTRA-14, because the one-away aggressor rows 112 and 116 have less of a row hammer impact on the victim row 108 than the immediate neighboring rows 110 and 114 due to the fact that the one-away aggressor rows 112 and 116 are farther away (in terms of distance) from the victim row 108 than the immediate neighboring rows 110 and 114.

The counter CTRB-8 is incremented in response to the scaled count of any of the counters CTRA-10, CTRA-12, CTRA-14, and CTRA-16. The scaled counts of CTRA-10, CTRA-12, CTRA-14, and CTRA-16 are provided to inputs of a logical OR gate 304, which can be implemented using one or more hardware circuits or machine-readable instructions. The output of the logical OR gate 304 provides an increment (I) input to the counter CTRB-8 (in examples where CTRB-8 is incremented). In other examples where the counter CTRB-8 is decremented, the output of the logical OR gate 304 is a decrement input to the counter.

In further examples, the logical OR gate 304 can receive further scaled counts from additional counters CTRA associated with aggressor rows that are farther away than the one-away aggressor rows. In such further examples, additional scaled counts W3, etc., can be input to the logical OR gate 304 to cause advancing of the counter CTRB-8.

The count of CTRB-8 is compared by the row hammer disturbance mitigation engine 130 to a threshold T2. The threshold T2 can be a configuration parameter stored in a storage medium in the memory device 100, such as a configuration register or another type of storage medium. In examples where counters are incremented, if the row hammer disturbance mitigation engine 130 determines that the count of CTRB-8 exceeds the threshold T2, then the row hammer disturbance mitigation engine 130 activates a row hammer indication to indicate that the associated victim row 108 has experienced a row hammer disturbance. The memory refresh engine 132 can refresh row(s) including the victim row 108 in response to the row hammer indication.

In further examples where counters are decremented, if the row hammer disturbance mitigation engine 130 determines that the count of CTRB-8 is less than the threshold T2, then the row hammer disturbance mitigation engine 130 activates a row hammer indication to indicate that the associated victim row 108 has experienced a row hammer disturbance.

In some examples, Weight1≥1, while Weight2>Weight1. Generally, the scaled advance of a counter CTRB associated with a victim row is based on a weight that increases proportionally to a distance of an aggressor row to the victim row.

In further examples, different scaling techniques can be used to define scale factors for a counter CTRB based on counts of associated counters CTRA.

Figure 4:
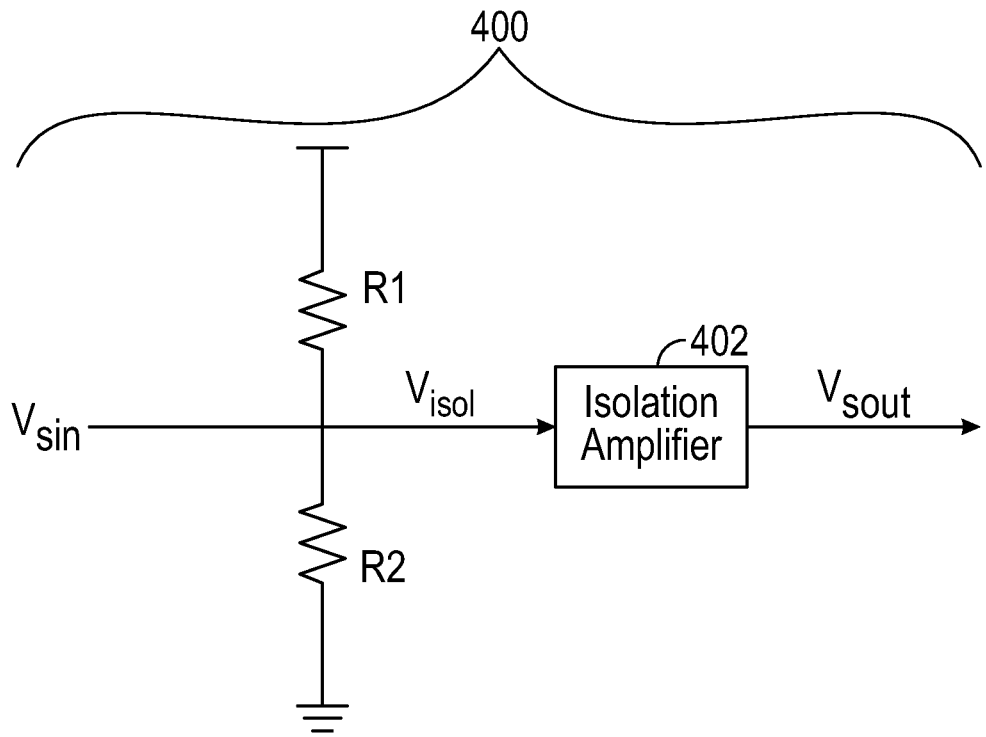
FIG. 4 is a block diagram of an analog scaling circuit, according to some examples.

In examples where counters are analog counters, scaling factors can be based on use of isolation amplifiers. FIG. 4 shows an example scaling circuit 400 for use with analog counters. The scaling circuit 400 includes an isolation amplifier 402 and a voltage divider formed with resistors R1 and R2. The voltage divider reduces the input voltage $V_{isol}$ to the isolation amplifier 402 that is a fraction (less than 1) of an input voltage $V_{sin}$ to the scaling circuit 400, based on the relative resistances of R1 and R2.

The isolation amplifier 402 produces a scaled output voltage $V_{sout}$ that is equal in voltage to $V_{isol}$, assuming that the isolation amplifier 402 has unity gain. The scaled output voltage $V_{sout}$ can be used as the input to an analog counter, such as Vin to the analog counter 210 of FIG. 2B. The isolation amplifier 402 provides electrical isolation between $V_{sin}$ and $V_{sout}$, to prevent the operation of the analog counter 210 from changing the voltage level of $V_{sin}$. The scaling that is applied is based on the relative resistances of resistors R1 and R2.

More specifically, $V_{isol} = D \cdot V_{sin}$, where $$D = \frac{R2}{R1 + R2}.$$

In this example, the scaling factor is $$\frac{1}{D}.$$

In other examples, the voltage divider including resistors R1 and R2 can be omitted if the isolation amplifier 402 has a gain less than 1. The gain (G) of the isolation amplifier 402 that is less than 1 provides a scaling factor $$\frac{1}{G}.$$

Each counter CTRB has a reset (R) input that triggers a reset of CTRB to an initial value (e.g., an initial low value or an initial high value) when the reset input is activated. In the example of FIG. 3, the counter CTRB-8 has a reset input connected to a reset indication 302. The reset indication 302 (e.g., a reset signal or any other type of indicator) is activated in response to an operation that accesses the victim row 108. For example, the reset indication 302 can be activated in response to a refresh operation that refreshes a refresh region (of the memory device 100) that includes the victim row 108. As another example, the reset indication 302 can be activated in response to a read or write of the victim row 108. The refresh or read/write access serves to recover memory cells of the victim row 108 to their respective states so that the counter CTRB-8 can be reset and the row hammer detection process restarted for the victim row 108.

In examples where a refresh operation refreshes a refresh region with multiple rows of memory cells, the counters CTRB associated with the multiple rows of memory cells can be reset in response to the refresh operation.

Other rows of the memory device 100 each is associated with a counter CTRB that is advanced in similar fashion based on scaled counts from counters CTRA associated with a respective collection of aggressor rows.

First Type Row Hammer Disturbance Detection

As noted above, a counter CTRA associated with each row of memory cells can be used to detect the first type of row hammer disturbance.

The following assumes an example where counters are incremented.

Assume the example of FIG. 1 where the aggressor row 102 can cause a row hammer disturbance of neighboring victim rows 104 and 106. The counter CTRA-2 associated with the aggressor row 102 is incremented in response to each activation of the aggressor row 102.

The row hammer disturbance mitigation engine 130 compares the count of the counter CTRA-2 to a threshold T1. The threshold T1 can be a configuration parameter stored in a storage medium in the memory device 100, such as a configuration register or another type of storage medium. In examples where counters are incremented, if the count of the counter CTRA-2 exceeds the threshold T1, then the row hammer disturbance mitigation engine 130 can cause a refresh of a refresh region (or multiple refresh regions) that include(s) the victim rows 104 and 106 that are neighbors of the aggressor row 102.

In examples where counters are decremented, if the count of the counter CTRA-2 is less than the threshold T1, then the row hammer disturbance mitigation engine 130 can cause a refresh of a refresh region (or multiple refresh regions) that include(s) the victim rows 104 and 106.

Further Examples

Figure 5A:
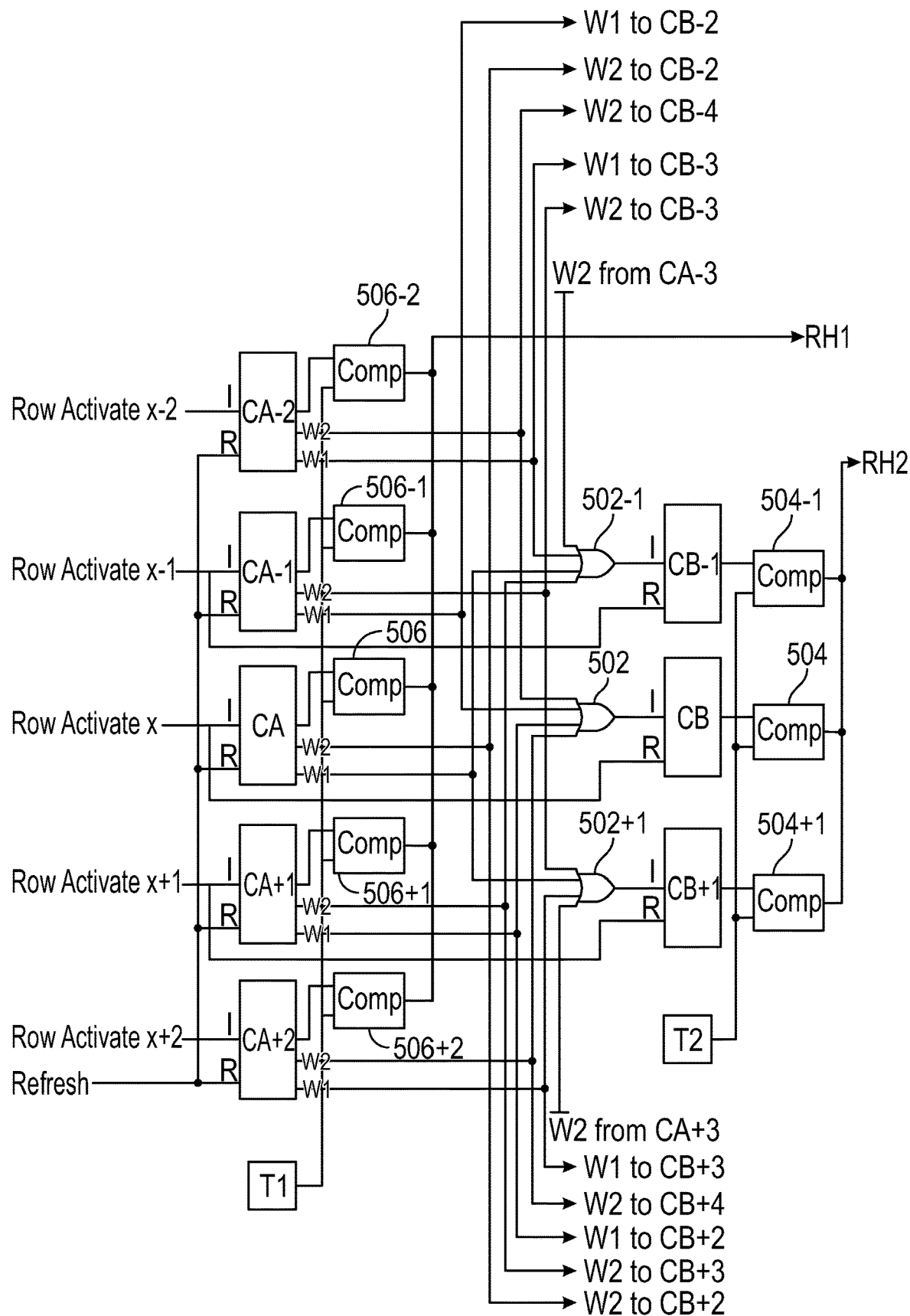
FIGS. 5A and 5B are block diagrams of row hammer counters in a memory device, according to some examples.

FIG. 5A shows an example portion of a memory device including circuitry for five rows of memory cells (rows x-2, x-1, x, x+1, and x+2). Rows x-1 and x+1 are the immediate neighboring rows of row x, and rows x-2 and x+2 are the one-away neighboring rows of row x.

Row x is associated with counters CA and CB. In FIG. 5A, "CA" represents a counter CTRA discussed above, and "CB" represents a counter CRTB discussed above. Row x-1 is associated with counters CA-1 and CB-1, and row x+1 is associated with counters CA+1 and CB+1. Row x-2 is associated with counters CA-2 and CB-2, and row x+2 is associated with counters CA+2 and CB+2.

Each counter CA-2, CA-1, CA, CA+1, CA+2 outputs a respective scaled count W1 (based on Weight1) and a respective scaled count W2 (based on Weight2).

The following assumes that the counters of FIG. 5A are incrementing counters. Similar mechanisms can be employed with decrementing counters.

The counter CA-2 is incremented in response to activation of row x-2 ("Row Activate x-2"), the counter CA-1 is incremented in response to activation of row x-1 ("Row Activate x-1"), the counter CA is incremented in response to activation of row x ("Row Activate x"), the counter CA+1 is incremented in response to activation of row x+1 ("Row Activate x+1"), and the counter CA+2 is incremented in response to activation of row x+2 ("Row Activate x+2").

The counters CA-2, CA-1, CA, CA+1, and CA+2 are reset in response to a refresh ("Refresh") of a refresh region that includes the counters CA-2, CA-1, CA, CA+1, and CA+2.

Each of the counters CB-1, CB, and CB+1 is incremented in response to scaled counts from a set of four neighboring rows; in other examples, each counter CB-1, CB, or CB+1 is incremented in response to scaled counts from a set of six or more neighboring rows. The counter CB-1 is incremented in response to an active output from a logical OR gate 502-1, the counter CB is incremented in response to an active output from a logical OR gate 502, and the counter CB+1 is incremented in response to an active output from a logical OR gate 502+1.

The logical OR gate 502-1 receives the following scaled counts: W2 from a counter CA-3 (which is associated with row x-3 that is three rows away from row x), W1 from the counter CA-2, W1 from the counter CA, and W2 from the counter CA+1). The logical OR gate 502 receives the following scaled counts: W2 from the counter CA-2, W1 from the counter CA-1, W1 from the counter CA+1, and W2 from the counter CA+2). The logical OR gate 502+1 receives the following scaled counts: W2 from the counter CA-1, W1 from the counter CA, W1 from the counter CA+2, and W2 from the counter CA+3 (which is associated with row x+3 that is three rows away from row x).

In FIG. 5A, "CB-2" refers to the counter CTRB associated with row x-2, "CB-3" refers to the counter CTRB associated with row x-3, and "CB-4" refers to the counter CTRB associated with row x-4 (which is four rows away from row x).

In FIG. 5A, "CB+2" refers to the counter CTRB associated with row x+2, "CB+3" refers to the counter CTRB associated with row x+3, and "CB+4" refers to the counter CTRB associated with row x+4 (which is four rows away from row x).

The counter CB-1 is reset in response to an activation of row x-1 (either due to a read or write access of row x-1 or a refresh of row x-1), the counter CB is reset in response to an activation of row x (either due to a read or write access of row x or a refresh of row x), and the counter CB+1 is reset in response to an activation of row x+1 (either due to a read or write access of row x+1 or a refresh of row x+1).

To detect the second type of row hammer disturbance, a comparator 504-1 of the row hammer disturbance mitigation engine 130 compares a count of the counter CB-1 to the threshold T2, and activates a row hammer disturbance indication RH2 if the count of the counter CB-1 is equal (or is greater than or equal) to T2. A comparator 504 of the row hammer disturbance mitigation engine 130 compares a count of the counter CB to the threshold T2, and activates the row hammer disturbance indication RH2 if the count of the counter CB is equal (or is greater than or equal) to T2. A comparator 504+1 of the row hammer disturbance mitigation engine 130 compares a count of the counter CB+1 to the threshold T2, and activates the row hammer disturbance indication RH2 if the count of the counter CB+1 is equal (or is greater than or equal) to T2.

Activation of RH2 indicates that the second type of row hammer disturbance has occurred, and causes a mitigation action (e.g., a refresh operation) to be taken with respect to the victim row affected by the second type of row hammer disturbance.

To detect the first type of row hammer disturbance, a comparator 506-2 of the row hammer disturbance mitigation engine 130 compares a count of the counter CA-2 to the threshold T1, and activates a row hammer disturbance indication RH1 if the count of the counter CA-2 is equal (or is greater than or equal) to T1. A comparator 506-1 of the row hammer disturbance mitigation engine 130 compares a count of the counter CA-1 to the threshold T1, and activates the row hammer disturbance indication RH1 if the count of the counter CA-1 is equal (or is greater than or equal) to T1. A comparator 506 of the row hammer disturbance mitigation engine 130 compares a count of the counter CA to the threshold T1, and activates the row hammer disturbance indication RH1 if the count of the counter CA is equal (or is greater than or equal) to T1. A comparator 506+1 of the row hammer disturbance mitigation engine 130 compares a count of the counter CA+1 to the threshold T1, and activates the row hammer disturbance indication RH1 if the count of the counter CA+1 is equal (or is greater than or equal) to T1. A comparator 506+2 of the row hammer disturbance mitigation engine 130 compares a count of the counter CA+2 to the threshold T1, and activates the row hammer disturbance indication RH1 if the count of the counter CA+2 is equal (or is greater than or equal) to T1.

In FIGS. 1, 3, and 5A, the counters CTRA can be referred to as "aggressor counters," since they represent quantities of activations of rows that can cause row hammer disturbance of neighboring rows. The counters CTRB can be referred to as "victim counters," since they contain counts for victim rows.

In FIG. 5A, neighboring rows of memory cells that are aggressor rows for row x include rows x−1, x−2, x+1, and x+2.

Rows x−1 and x−2 are on a first side of row x, and rows x+1 and x+2 are on a different second side of the row x. Each of rows x−1 and x+1 is an immediate neighbor of row x, while each of rows x−2 and x+2 is a one-away neighbor of row x. The same weight Weight1 is used to scale counts of the counters CA−1 and CA+1 for advancing CB for row x, and the same weight Weight2 is used to scale counts of the counters CA−2 and CA+2 for advancing CB for row x, where Weight2 is greater than Weight1.

A controller in the memory device activates row x based on a count of the victim counter (CB). A "controller" can refer to one or more hardware processing circuits, or a combination of one or more hardware processing circuits and machine-readable instructions executable by the one or more hardware processing circuits. As an example, the controller can include the row hammer disturbance mitigation engine 130 of FIG. 1.

The controller activates row x by refreshing a refresh region of the memory device, where the refresh region includes row x.

The controller activates row x based on the count of the victim counter (CB) having a specified relationship with respect to a threshold (e.g., the count of the counter CB being equal (or greater than or equal) to T2 if the victim counter is an incrementing counter, or the count of the counter CB being equal (or less than or equal) to T2 if the victim counter is a decrementing counter).

Figure 5B:
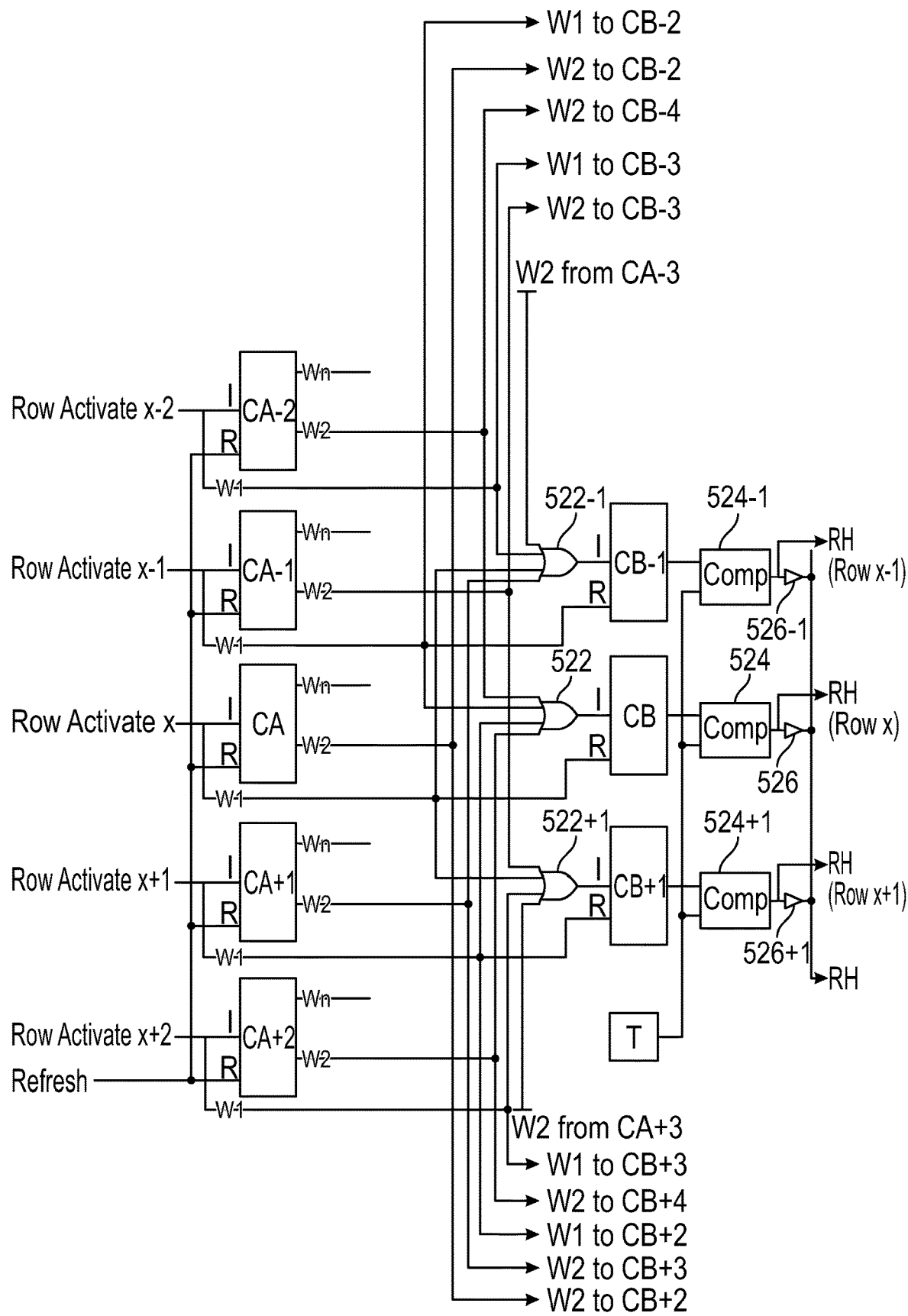

FIG. 5B shows an example portion of a memory device including circuitry for five rows of memory cells (rows x−2, x−1, x, x+1, and x+2). Rows x−1 and x+1 are the immediate neighboring rows of row x, and rows x−2 and x+2 are the one-away neighboring rows of row x.

The circuitry of FIG. 5B is to detect a row hammer disturbance according to further examples of the present disclosure. The row hammer disturbance detection circuitry of FIG. 5B does not distinguish between the first and second types of row hammer disturbance, just that a row hammer disturbance has occurred.

The row hammer disturbance detection circuitry of FIG. 5B includes aggressor counters CA−2, CA−1, CA, CA+1, and CA+2 associated with respective rows x−2, x−1, x, x+1, and x+2.

In the example of FIG. 5B, it is assumed that the count W1 has Weight1=1, so that a respective row activate signal can be used as W1 as inputs to respective logical OR gates 522−1, 522, and 522 (as well as other logical OR gates).

Each counter CA−2, CA−1, CA, CA+1, or CA+2 can output a respective scaled count W2 to Wn (n≥2), where the scaled count W2 is to advance a victim counter (e.g., CB−1, CB, or CB+1) to reflect a row hammer disturbance of a one-away row, and the scaled count Wn is to advance a victim counter (e.g., CB−1, CB, or CB+1) to reflect a row hammer disturbance of an (n−1)-away row. An (n−1)-away row is an aggressor row where there are (n−1) intervening row(s) of memory cells between the victim row and the aggressor row.

W2 represents a scaled count of a counter as scaled by the scaling factor derived from Weight2, and Wn represents a scaled count of a counter as scaled by the scaling factor derived from Weightn. Although not shown in FIG. 5B, the scaled counts Wn from the aggressor counters CA−2, CA−1, CA, CA+1, and CA+2 can be provided as further inputs to the logical OR gates (e.g., 522−1, 522, and 522+1).

Although not shown in FIG. 5A, each of the counters CA−2, CA−1, CA, CA+1, and CA+2 can also output respective scaled counts Wn.

The counter CB−1 is incremented in response to an active output from the logical OR gate 522−1, the counter CB is incremented in response to an active output from the logical OR gate 522, and the counter CB+1 is incremented in response to an active output from the logical OR gate 522+1.

To detect a row hammer disturbance, a comparator 524−1 of the row hammer disturbance mitigation engine 130 compares a count of the counter CB−1 to a threshold T, and activates a row hammer disturbance indication RH(Row x−1) if the count of the counter CB−1 is equal (or is greater than or equal) to T. A comparator 524 of the row hammer disturbance mitigation engine 130 compares a count of the counter CB to the threshold T, and activates a row hammer disturbance indication RH(Row x) if the count of the counter CB is equal (or is greater than or equal) to T. A comparator 524+1 of the row hammer disturbance mitigation engine 130 compares a count of the counter CB+1 to the threshold T, and activates a row hammer disturbance indication RH(row x+1) if the count of the counter CB+1 is equal (or is greater than or equal) to T.

The row hammer disturbance indication RH(Row x−1) when active indicates that the victim row x−1 has experienced a row hammer disturbance, the row hammer disturbance indication RH(Row x) when active indicates that the victim row x has experienced a row hammer disturbance, and the row hammer disturbance indication RH(Row x+1) when active indicates that the victim row x+1 has experienced a row hammer disturbance.

The row hammer disturbance indications RH(Row x−1), RH(Row x), and RH(Row x+1) provide individual indications of row hammer disturbance of individual rows.

The outputs of the comparators 524−1, 524, and 524−2 can also be provided to inputs of respective buffers 526−1, 526, 526+1 (e.g., tristate buffers). The outputs of the buffers 526−1, 526, 526+1 are connected to an RH signal. Effectively, the collection of the buffers 526−1, 526, 526+1 provide a logical OR operation such that when any of the row hammer disturbance indications RH(Row x−1), RH(Row x), and RH(Row x+1) is active, the RH signal is active to provide an indication that a row hammer disturbance has occurred to at least one victim row in the memory device.

Although not depicted in FIG. 5A, the row hammer disturbance detection circuit of FIG. 5A can similarly produce individual row hammer disturbance indications such as RH(Row x−1), RH(Row x), and RH(Row x+1), with RH2 in FIG. 5A being a logical OR of these signals, where the logical OR can be implemented using buffers such as 526−1, 526, and 526+1 in FIG. 5B.

Figure 6:
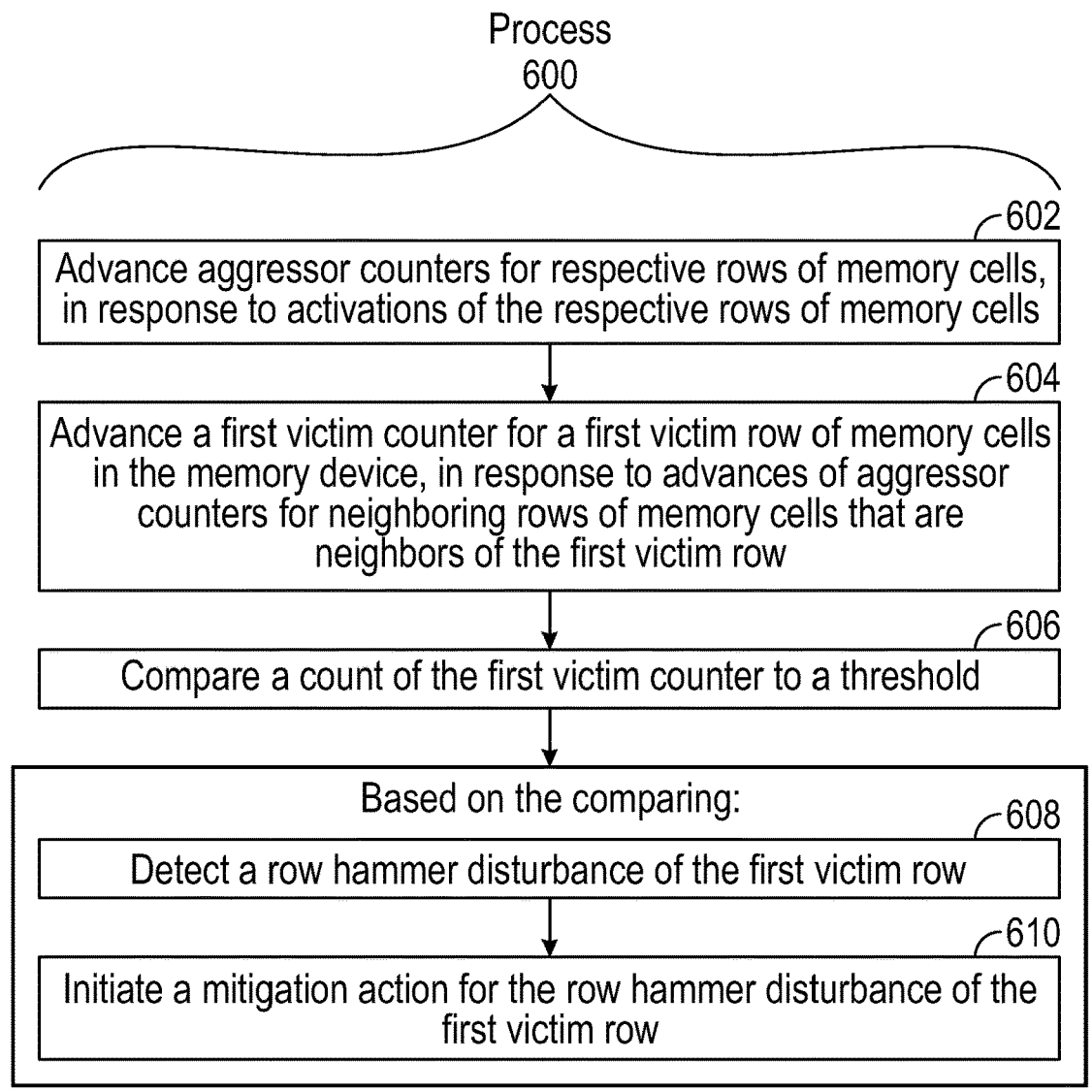
FIG. 6 is a flow diagram of a process according to some examples.

FIG. 6 is a flow diagram of a process 600 according to some examples.

The process 600 includes advancing (at 602) aggressor counters for respective rows of memory cells, in response to activations of the respective rows of memory cells. The aggressor counters can be the counters CTRA or CA depicted in FIGS. 1, 3, and 5, for example. Advancing an aggressor counter can include incrementing or decrementing the aggressor counter.

The process 600 includes advancing (at 604) a first victim counter for a first victim row of memory cells in the memory device, in response to advances of aggressor counters for neighboring rows of memory cells that are neighbors of the first victim row. The victim counters can be the counters CTRB or CB depicted in in FIGS. 1, 3, and 5, for example. Advancing a victim counter can include incrementing or decrementing the victim counter.

In some examples, the first victim counter is advanced in response to a first scaled count of a first aggressor counter for a first neighboring row of the neighboring rows, where the first scaled count is based on a first weight. In some examples, the first victim counter is further advanced in response to a second scaled count of a second aggressor counter for a second neighboring row of the neighboring rows, where the second scaled count is based on a second weight.

In some examples, the first weight corresponds to a first distance of the first neighboring row to the first victim row, and the second weight corresponds to a second distance of the second neighboring row to the first victim row.

The process 600 includes comparing (at 606) a count of the first victim counter to a threshold (e.g., comparing the count of a counter CTRB or CB to T2).

Based on the comparing, the process 600 includes detecting (at 608) a row hammer disturbance of the first victim row and initiating (at 610) a mitigation action for the row hammer disturbance of the first victim row. The mitigation action can include refreshing a refresh region including the first victim row.

Figure 7:
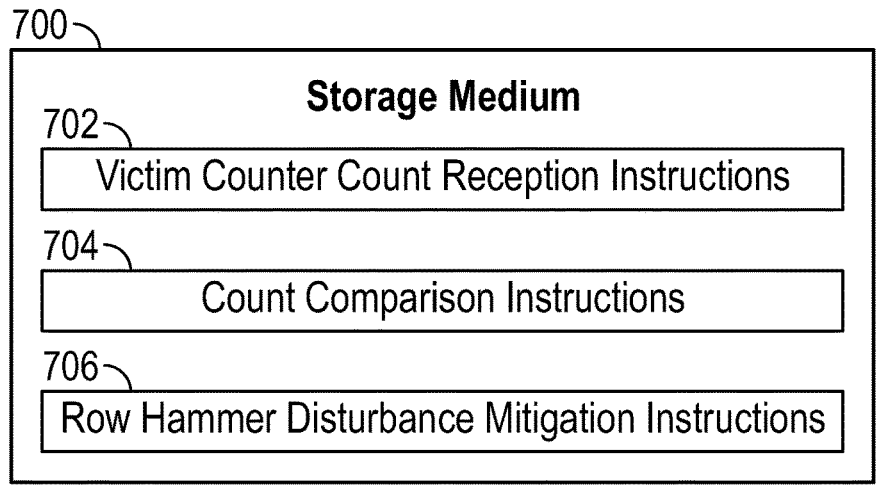
FIG. 7 is a block diagram of a storage medium storing machine-readable instructions according to some examples.

In some examples, the row hammer disturbance mitigation engine 130 of FIG. 1 can be implemented using machine-readable instructions. FIG. 7 is a block diagram of a non-transitory machine-readable or computer-readable storage medium 700 storing machine-readable instructions that upon execution cause a controller in a memory device to perform various tasks. The machine-readable instructions stored in the storage medium 700 can be those of the row hammer disturbance mitigation engine 130, for example.

The machine-readable instructions include victim counter count reception instructions 702 to receive a count of a first victim counter for a first victim row of memory cells in the memory device, the first victim counter to advance responsive to scaled counts of aggressor counters for neighboring rows of memory cells that are neighbors of the first victim row. The scaled counts include a first scaled count based on a first scaling factor for a first aggressor counter associated with a first neighboring row of the neighboring rows, and a second scaled count based on a second scaling factor for a second aggressor counter associated with a second neighboring row of the neighboring rows, where the first scaling factor is different from the second scaling factor.

The machine-readable instructions include count comparison instructions 704 to compare the count of the first victim counter to a threshold.

The machine-readable instructions include row hammer disturbance mitigation instructions 706 to, based on the comparing, detect a row hammer disturbance of the first row and initiate a mitigation action for the row hammer disturbance of the first row.

The storage medium 700 can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disk (CD) or a digital video disk (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A memory device comprising:
   a plurality of rows of memory cells;
   a plurality of victim counters associated with respective rows of memory cells of the plurality of rows of memory cells; and
   a plurality of aggressor counters associated with the respective rows of memory cells,
   wherein a first victim counter of the plurality of victim counters is associated with a first row of the plurality of rows of memory cells, a count of the first victim counter to advance in response to advances in counts of aggressor counters associated with neighboring rows of memory cells that are neighbors of the first row, and wherein the count of the first victim counter represents an amount of row hammer disturbance of the first row due to activations of the neighboring rows of memory cells.

2. The memory device of claim 1, wherein the neighboring rows of memory cells comprise a first neighboring row of memory cells and a second neighboring row of memory cells, and the aggressor counters associated with the neighboring rows of memory cells comprise a first aggressor counter associated with the first neighboring row of memory cells and a second aggressor counter associated with the second neighboring row of memory cells, and
   wherein the first victim counter is to advance in response to a first scaled count of the first aggressor counter.

3. A memory device comprising:
   a plurality of rows of memory cells;
   a plurality of victim counters associated with respective rows of memory cells of the plurality of rows of memory cells; and
   a plurality of aggressor counters associated with the respective rows of memory cells,
   wherein a first victim counter of the plurality of victim counters is associated with a first row of the plurality of rows of memory cells, the first victim counter to advance in response to advances in counts of aggressor counters associated with neighboring rows of memory cells that are neighbors of the first row, wherein the neighboring rows of memory cells comprise a first neighboring row of memory cells and a second neighboring row of memory cells, and the aggressor counters associated with the neighboring rows of memory cells comprise a first aggressor counter associated with the first neighboring row of memory cells and a second aggressor counter associated with the second neighboring row of memory cells, and wherein the first victim counter is to advance in response to a first scaled count of the first aggressor counter and a second scaled count of the second aggressor counter, the first scaled count based on a first weight and the second scaled count based on a second weight.

4. The memory device of claim 3, wherein the first neighboring row of memory cells is on a first side of the first row, and the second neighboring row of memory cells is on a different second side of the first row, and wherein the first weight is equal the second weight.

5. The memory device of claim 3, wherein the first neighboring row of memory cells is between the first row and the second neighboring row of memory cells, and wherein the first weight is greater than the second weight.

6. The memory device of claim 3, wherein the first scaled count of the first aggressor counter is based on a count of the first aggressor counter scaled according to the first weight, and the second scaled count of the second aggressor counter is based on a count of the second aggressor counter scaled according to the second weight.

7. The memory device of claim 3, wherein the neighboring rows of memory cells further comprise a third neighboring row of memory cells and a fourth neighboring row of memory cells, and the aggressor counters associated with the neighboring rows of memory cells comprise a third aggressor counter associated with the third neighboring row of memory cells and a fourth aggressor counter associated with the fourth neighboring row of memory cells, and wherein the first victim counter is to advance in response to a third scaled count of the third aggressor counter and a fourth scaled count of the fourth aggressor counter.

8. The memory device of claim 7, wherein the third scaled count is based on the first weight and the fourth scaled count is based on the second weight, wherein the second weight is different from the first weight.

9. The memory device of claim 1, further comprising:
a controller to activate the first row based on the count of the first victim counter.

10. The memory device of claim 9, wherein the controller is to activate the first row by refreshing a refresh region of the memory device, the refresh region including the first row.

11. The memory device of claim 9, wherein the controller is to activate the first row based on the count of the first victim counter having a specified relationship with respect to a threshold.

12. The memory device of claim 1, further comprising:
a controller to reset the first victim counter responsive to an access of the first row.

13. The memory device of claim 1, wherein the first victim counter is to advance by incrementing or decrementing the count of the first victim counter.

14. The memory device of claim 1, wherein the first victim counter comprises a digital counter or an analog counter.

15. The memory device of claim 1, wherein an advance input of the first victim counter is connected to an output of a logic gate, the logic gate having inputs connected to outputs of the aggressor counters.

16. The memory device of claim 1, wherein the first victim counter is to detect a given type of row hammer disturbance in which multiple aggressor rows of memory cells disturb a target victim row of memory cells, and wherein a first aggressor counter of the plurality of aggressor counters is to detect a different type of row hammer disturbance in which a first aggressor row associated with the first aggressor counter disturbs multiple victim rows of memory cells.

17. A method of a memory device, comprising:
advancing aggressor counters for respective rows of memory cells, based on activations of the respective rows of memory cells;
advancing a first victim counter for a first victim row of memory cells in the memory device, based on advances of aggressor counters for neighboring rows of memory cells that are neighbors of the first victim row, wherein the advancing of the first victim counter comprises:
advancing the first victim counter in response to a first scaled count of a first aggressor counter for a first neighboring row of the neighboring rows of memory cells, the first scaled count based on a first weight;
advancing the first victim counter in response to a second scaled count of a second aggressor counter for a second neighboring row of the neighboring rows of memory cells, the second scaled count based on a second weight different from the first weight; and
comparing a count of the first victim counter to a threshold; and
based on the comparing, detecting a row hammer disturbance of the first victim row and initiating a mitigation action for the row hammer disturbance of the first victim row.

18. The method of claim 17, wherein the first weight corresponds to a first distance of the first neighboring row to the first victim row, and the second weight corresponds to a second distance of the second neighboring row to the first victim row.

19. A non-transitory machine-readable storage medium comprising instructions that upon execution cause a controller in a memory device to:
receive a count of a first victim counter for a first victim row of memory cells in the memory device, the first victim counter to advance responsive to scaled counts of aggressor counters for neighboring rows of memory cells that are neighbors of the first victim row, the scaled counts comprising a first scaled count based on a first scaling factor for a first aggressor counter associated with a first neighboring row of the neighboring rows, and a second scaled count based on a second scaling factor for a second aggressor counter associated with a second neighboring row of the neighboring rows, wherein the first scaling factor is different from the second scaling factor;
compare the count of the first victim counter to a threshold; and
based on the comparing, detect a row hammer disturbance of the first victim row and initiate a mitigation action for the row hammer disturbance of the first victim row.

20. The non-transitory machine-readable storage medium of claim 19, wherein the count of the first victim counter represents an amount of row hammer disturbance of the first victim row due to activations of the neighboring rows of memory cells.

* * * * *